(12) United States Patent
Vanderaa (10) Patent No.: US 8,626,087 B2
(45) Date of Patent: Jan. 7, 2014

(54) WIRE HARNESS FOR FIELD DEVICES USED IN A HAZARDOUS LOCATIONS

(75) Inventor: Joel David Vanderaa, St. Paul, MN (US)

(73) Assignee: Rosemount Inc., Eden Prairie, MN (US)

( * ) Notice: Subject to any disclaimer, the term of this patent is extended or adjusted under 35 U.S.C. 154(b) by 198 days.

(21) Appl. No.: 12/870,416

(22) Filed: Aug. 27, 2010

(65) Prior Publication Data

US 2011/0014882 A1 Jan. 20, 2011

Related U.S. Application Data

(63) Continuation-in-part of application No. 12/485,169, filed on Jun. 16, 2009.

(60) Provisional application No. 61/239,120, filed on Sep. 2, 2009.

(51) Int. Cl.
*H04B 1/38* (2006.01)

(52) U.S. Cl.
USPC .......................................... 455/90.3; 455/41.2

(58) Field of Classification Search
CPC .............................. H01Q 1/243; H04W 84/18
USPC ............ 455/90.3, 41.2, 41.3, 557, 11.1, 66.1, 455/418; 370/310.2, 338
See application file for complete search history.

(56) References Cited

U.S. PATENT DOCUMENTS

| | | | |
|---|---|---|---|
| 2,533,339 A | 12/1950 | Willenborg | 177/311 |
| 2,640,667 A * | 6/1953 | Winn | 248/65 |
| 2,883,489 A | 4/1959 | Eadie, Jr. et al. | 335/148 |
| 3,012,432 A | 12/1961 | Moore et al. | 73/40 |
| 3,218,863 A | 11/1965 | Calvert | 73/398 |
| 3,229,759 A | 1/1966 | Grover et al. | 165/105 |
| 3,232,712 A | 2/1966 | Stearns | 23/255 |
| 3,249,833 A | 5/1966 | Vosteen | 317/246 |
| 3,374,112 A | 3/1968 | Danon | 117/226 |
| 3,557,621 A | 1/1971 | Ferran | 73/398 |
| 3,568,762 A | 3/1971 | Harbaugh | 165/105 |

(Continued)

FOREIGN PATENT DOCUMENTS

| | | |
|---|---|---|
| CH | 672 368 A5 | 11/1989 |
| CN | JP 06 199284 A | 7/1994 |

(Continued)

OTHER PUBLICATIONS

Notification of Transmittal of the International Search Report and the Written Opinion for the international patent application No. PCT/US2010/047444 dated Dec. 10, 2010.

(Continued)

*Primary Examiner* — Lana N Le
(74) *Attorney, Agent, or Firm* — Westman, Champlin & Koehler, P.A.

(57) ABSTRACT

A wireless process communication adapter includes a housing having a first end and a second end. A field device coupling is attached to one of the first and second ends. Adapter circuitry is disposed within the housing and the adapter circuitry is coupled to a plurality of wires that pass through the field device coupling. A wire retainer is engaged upon the plurality of wires to maintain the wires in a fixed position. An encapsulation material encapsulates the adapter circuitry, the wire retainer, and the plurality of wires.

11 Claims, 8 Drawing Sheets

(56) References Cited

U.S. PATENT DOCUMENTS

| | | | | |
|---|---|---|---|---|
| 3,612,851 A | 10/1971 | Fowler | | 362/30 |
| 3,631,264 A | 12/1971 | Morgan | | 327/309 |
| 3,633,053 A | 1/1972 | Peters et al. | | 310/15 |
| 3,697,835 A | 10/1972 | Satori | | 317/246 |
| D225,743 S | 1/1973 | Seltzer | | D10/102 |
| 3,742,450 A | 6/1973 | Weller | | 375/257 |
| 3,808,480 A | 4/1974 | Johnston | | 317/256 |
| 3,881,962 A | 5/1975 | Rubinstein | | 136/209 |
| 3,885,432 A | 5/1975 | Herzl | | 73/861.22 |
| 3,924,219 A | 12/1975 | Braun | | 338/34 |
| 3,931,532 A | 1/1976 | Byrd | | 310/4 |
| 4,005,319 A | 1/1977 | Nilsson et al. | | 310/8.3 |
| 4,008,619 A | 2/1977 | Alcaide et al. | | 73/398 |
| 4,042,757 A | 8/1977 | Jones | | 429/104 |
| 4,063,349 A | 12/1977 | Passler et al. | | 29/627 |
| 4,084,155 A | 4/1978 | Herzl et al. | | 340/870.39 |
| 4,116,060 A | 9/1978 | Frederick | | 73/861.22 |
| 4,125,122 A | 11/1978 | Stachurski | | 136/205 |
| 4,158,217 A | 6/1979 | Bell | | 361/283 |
| 4,168,518 A | 9/1979 | Lee | | 361/283 |
| 4,177,496 A | 12/1979 | Bell et al. | | 361/283 |
| 4,227,419 A | 10/1980 | Park | | 73/724 |
| 4,287,553 A | 9/1981 | Braunlich | | 361/283 |
| 4,295,179 A | 10/1981 | Read | | 361/600 |
| 4,322,724 A | 3/1982 | Grudzinski | | 340/595 |
| 4,322,775 A | 3/1982 | Delatorre | | 361/283 |
| 4,336,567 A | 6/1982 | Anastasia | | 361/283 |
| 4,358,814 A | 11/1982 | Lee et al. | | 361/283 |
| 4,361,045 A | 11/1982 | Iwasaki | | 73/654 |
| 4,370,890 A | 2/1983 | Frick | | 73/718 |
| 4,383,801 A | 5/1983 | Pryor | | 416/17 |
| 4,389,895 A | 6/1983 | Rud, Jr. | | 73/724 |
| 4,390,321 A | 6/1983 | Langlois et al. | | 417/15 |
| 4,422,125 A | 12/1983 | Antonazzi et al. | | 361/283 |
| 4,422,335 A | 12/1983 | Ohnesorge et al. | | 73/724 |
| 4,434,451 A | 2/1984 | Delatorre | | 361/283 |
| 4,455,874 A | 6/1984 | Paros | | 73/704 |
| 4,458,537 A | 7/1984 | Bell et al. | | 73/718 |
| 4,459,537 A | 7/1984 | McWhorter | | |
| 4,475,047 A | 10/1984 | Ebert | | 307/66 |
| 4,476,853 A | 10/1984 | Arbogast | | 126/578 |
| 4,485,670 A | 12/1984 | Camarda et al. | | 73/179 |
| 4,490,773 A | 12/1984 | Moffatt | | 361/283 |
| 4,510,400 A | 4/1985 | Kiteley | | 307/66 |
| 4,542,436 A | 9/1985 | Carusillo | | 361/283 |
| 4,562,742 A | 1/1986 | Bell | | 73/718 |
| 4,570,217 A | 2/1986 | Allen et al. | | 700/19 |
| 4,590,466 A | 5/1986 | Wiklund et al. | | 340/870.28 |
| 4,639,542 A | 1/1987 | Bass et al. | | 136/210 |
| 4,670,733 A | 6/1987 | Bell | | 338/36 |
| 4,701,938 A | 10/1987 | Bell | | 375/257 |
| 4,704,607 A | 11/1987 | Teather et al. | | 340/825.07 |
| 4,749,993 A | 6/1988 | Szabo et al. | | 340/870.31 |
| 4,785,669 A | 11/1988 | Benson et al. | | 73/718 |
| 4,860,232 A | 8/1989 | Lee et al. | | 364/571.04 |
| 4,875,369 A | 10/1989 | Delatorre | | 73/151 |
| 4,878,012 A | 10/1989 | Schulte et al. | | 324/60 |
| 4,926,674 A | 5/1990 | Fossum et al. | | 73/4 |
| 4,951,174 A | 8/1990 | Grantham et al. | | 361/283.1 |
| 4,977,480 A | 12/1990 | Nishihara | | 73/724 |
| 4,982,412 A | 1/1991 | Gross | | 377/6 |
| 5,009,311 A | 4/1991 | Schenk | | 206/332 |
| 5,014,176 A | 5/1991 | Kelleher et al. | | 363/26 |
| 5,023,746 A | 6/1991 | Epstein | | 361/56 |
| 5,025,202 A | 6/1991 | Ishii et al. | | 220/101 |
| 5,060,295 A | 10/1991 | Borras et al. | | 455/186 |
| 5,079,562 A * | 1/1992 | Yarsunas et al. | | 343/792 |
| 5,094,109 A | 3/1992 | Dean et al. | | 73/718 |
| D331,370 S | 12/1992 | Williams | | D10/46 |
| 5,168,419 A | 12/1992 | Delatorre | | 361/283 |
| 5,170,671 A | 12/1992 | Miau et al. | | 73/861.22 |
| 5,194,819 A | 3/1993 | Briefer | | 73/718 |
| 5,223,763 A | 6/1993 | Chang | | 310/339 |
| 5,230,250 A | 7/1993 | Delatorre | | 73/733 |
| 5,233,875 A | 8/1993 | Obermeier et al. | | 73/718 |
| D345,107 S | 3/1994 | Williams | | D10/46 |
| 5,313,831 A | 5/1994 | Beckman | | 73/204.24 |
| 5,329,818 A | 7/1994 | Frick et al. | | 73/708 |
| 5,412,535 A | 5/1995 | Chao et al. | | 361/700 |
| 5,492,016 A | 2/1996 | Pinto et al. | | 73/724 |
| 5,495,769 A | 3/1996 | Broden et al. | | 73/18 |
| 5,506,757 A | 4/1996 | Brorby | | 361/796 |
| 5,531,936 A | 7/1996 | Kanatzidis et al. | | 252/587 |
| 5,542,300 A | 8/1996 | Lee | | 73/724 |
| 5,554,809 A | 9/1996 | Tobita et al. | | 73/700 |
| 5,554,922 A | 9/1996 | Kunkel | | 322/3 |
| 5,599,172 A | 2/1997 | McCabe | | 417/334 |
| 5,606,513 A | 2/1997 | Louwagie et al. | | 702/138 |
| 5,610,552 A | 3/1997 | Schlesinger et al. | | 327/560 |
| 5,614,128 A | 3/1997 | Kanatzidis et al. | | 252/582 |
| 5,618,471 A | 4/1997 | Kanatzidis et al. | | 252/582 |
| 5,637,802 A | 6/1997 | Frick et al. | | 73/724 |
| 5,642,301 A | 6/1997 | Warrior et al. | | 364/571.02 |
| 5,644,185 A | 7/1997 | Miller | | 310/306 |
| 5,656,782 A | 8/1997 | Powell, II et al. | | 73/756 |
| 5,665,899 A | 9/1997 | Willcox | | 731/1.63 |
| 5,682,476 A | 10/1997 | Tapperson et al. | | 395/200.05 |
| 5,705,978 A | 1/1998 | Frick et al. | | 340/511 |
| 5,722,249 A | 3/1998 | Miller, Jr. | | 62/238.2 |
| 5,726,845 A | 3/1998 | Ho | | |
| 5,726,846 A | 3/1998 | Houbre | | 361/93 |
| 5,754,419 A | 5/1998 | Ho | | |
| 5,757,608 A | 5/1998 | Bernot et al. | | 361/283.4 |
| 5,764,891 A | 6/1998 | Warrior | | 710/72 |
| 5,787,120 A | 7/1998 | Louagie et al. | | 375/257 |
| 5,793,963 A | 8/1998 | Tapperson et al. | | 395/200.31 |
| 5,803,604 A | 9/1998 | Pompei | | 374/181 |
| 5,811,201 A | 9/1998 | Skowronski | | 429/17 |
| 5,851,083 A | 12/1998 | Palan | | 403/337 |
| 5,870,695 A | 2/1999 | Brown et al. | | 702/138 |
| 5,872,494 A | 2/1999 | Palan et al. | | 333/252 |
| 5,899,962 A | 5/1999 | Louwagie et al. | | 702/138 |
| 5,911,162 A | 6/1999 | Denner | | 73/718 |
| 5,929,372 A | 7/1999 | Oudoire et al. | | 136/208 |
| 5,954,526 A | 9/1999 | Smith | | 439/136 |
| 5,957,727 A | 9/1999 | Page, Jr. | | 439/607.58 |
| 5,978,658 A | 11/1999 | Shoji | | 455/66 |
| 5,992,240 A | 11/1999 | Tsuruoka et al. | | 73/718 |
| 6,013,204 A | 1/2000 | Kanatzidis et al. | | 252/584 |
| 6,038,927 A | 3/2000 | Karas | | 73/706 |
| 6,079,276 A | 6/2000 | Frick et al. | | 73/18 |
| 6,104,759 A | 8/2000 | Carkner et al. | | 375/295 |
| 6,109,979 A | 8/2000 | Garnett | | 439/709 |
| 6,126,327 A | 10/2000 | Bi et al. | | 709/221 |
| 6,127,739 A | 10/2000 | Appa | | 290/55 |
| 6,150,798 A | 11/2000 | Ferry et al. | | 323/273 |
| D439,177 S | 3/2001 | Fandrey et al. | | D10/46 |
| D439,178 S | 3/2001 | Fandrey et al. | | D10/46 |
| D439,179 S | 3/2001 | Fandrey et al. | | D10/46 |
| D439,180 S | 3/2001 | Fandrey et al. | | D10/85 |
| D439,181 S | 3/2001 | Fandrey et al. | | D10/46 |
| D441,672 S | 5/2001 | Fandrey et al. | | D10/52 |
| 6,236,096 B1 | 5/2001 | Chang et al. | | 257/419 |
| 6,236,334 B1 | 5/2001 | Tapperson et al. | | 340/825 |
| 6,255,010 B1 | 7/2001 | George et al. | | 429/30 |
| 6,282,247 B1 | 8/2001 | Shen | | 375/285 |
| 6,295,875 B1 | 10/2001 | Frick et al. | | 73/718 |
| 6,312,617 B1 | 11/2001 | Kanatzidis et al. | | 252/62.3 |
| 6,326,764 B1 | 12/2001 | Virtudes | | 320/101 |
| 6,338,283 B1 | 1/2002 | Blazquez Navarro | | 73/865.8 |
| 6,360,277 B1 | 3/2002 | Ruckley et al. | | 709/250 |
| 6,385,972 B1 | 5/2002 | Fellows | | 60/517 |
| 6,405,139 B1 | 6/2002 | Kicinski et al. | | 702/33 |
| 6,429,786 B1 | 8/2002 | Bansemir et al. | | 340/870.27 |
| 6,441,747 B1 | 8/2002 | Khair et al. | | 340/870.16 |
| 6,457,367 B1 | 10/2002 | Behm et al. | | 73/753 |
| 6,480,699 B1 | 11/2002 | Lovoi | | 455/41.2 |
| 6,484,107 B1 | 11/2002 | Roper et al. | | 702/50 |
| 6,487,912 B1 | 12/2002 | Behm et al. | | 73/753 |
| 6,504,489 B1 | 1/2003 | Westfield et al. | | 340/870.3 |
| 6,508,131 B2 | 1/2003 | Frick | | 73/756 |
| 6,510,740 B1 | 1/2003 | Behm et al. | | 73/708 |
| 6,511,337 B1 | 1/2003 | Fandrey et al. | | 439/320 |
| D471,829 S | 3/2003 | Dennis et al. | | D10/85 |

(56) References Cited

U.S. PATENT DOCUMENTS

| | | | |
|---|---|---|---|
| D472,831 S | 4/2003 | Dennis et al. | D10/85 |
| 6,546,805 B2 | 4/2003 | Fandrey et al. | 73/753 |
| 6,553,076 B1 | 4/2003 | Huang | 375/257 |
| 6,563,908 B1 | 5/2003 | Enck, Jr. | |
| 6,568,279 B2 | 5/2003 | Behm et al. | 73/753 |
| 6,571,132 B1 | 5/2003 | Larson et al. | 700/2 |
| 6,574,515 B1 | 6/2003 | Kirkpatrick et al. | 700/19 |
| 6,593,857 B1 | 7/2003 | Roper et al. | 340/870.3 |
| 6,609,427 B1 | 8/2003 | Schnaare et al. | 73/753 |
| 6,640,308 B1 | 10/2003 | Keyghobad et al. | 713/300 |
| 6,661,220 B1 | 12/2003 | Glehr | 324/207.17 |
| 6,662,662 B1 | 12/2003 | Nord et al. | 73/715 |
| 6,667,594 B2 | 12/2003 | Chian | 318/696 |
| 6,680,690 B1 | 1/2004 | Nilsson et al. | 342/124 |
| 6,690,182 B2 | 2/2004 | Kelly et al. | 324/700 |
| 6,711,446 B2 | 3/2004 | Kirkpatrick et al. | 700/19 |
| 6,747,573 B1 | 6/2004 | Gerlach et al. | 340/870.21 |
| 6,765,968 B1 | 7/2004 | Nelson et al. | 375/257 |
| 6,774,814 B2 | 8/2004 | Hilleary | 340/870.07 |
| 6,778,100 B2 | 8/2004 | Schempf | 340/870.07 |
| 6,792,259 B1 | 9/2004 | Parise | 455/343.1 |
| 6,823,072 B1 | 11/2004 | Hoover | 381/7 |
| 6,838,859 B2 | 1/2005 | Shah | 322/38 |
| 6,839,546 B2 | 1/2005 | Hedtke | 455/67.11 |
| 6,839,790 B2 | 1/2005 | Barros De Almeida et al. | 710/305 |
| 6,843,110 B2 | 1/2005 | Deane et al. | 73/114.35 |
| 6,891,477 B2 | 5/2005 | Aronstam | 340/606 |
| 6,891,838 B1 | 5/2005 | Petite et al. | 370/401 |
| 6,898,980 B2 | 5/2005 | Behm et al. | 73/756 |
| 6,904,295 B2 | 6/2005 | Yang | 455/522 |
| 6,907,383 B2 | 6/2005 | Eryurek et al. | 702/183 |
| 6,910,332 B2 | 6/2005 | Fellows | 60/520 |
| 6,942,728 B2 | 9/2005 | Caillat et al. | 117/3 |
| 6,984,899 B1 | 1/2006 | Rice | 290/44 |
| 6,995,677 B2 | 2/2006 | Aronstam et al. | 340/606 |
| 6,995,685 B2 | 2/2006 | Randall | 340/870.39 |
| 7,010,294 B1 | 3/2006 | Pyotsia et al. | 455/420 |
| 7,036,983 B2 | 5/2006 | Green et al. | 374/179 |
| 7,043,250 B1 | 5/2006 | DeMartino | 455/445 |
| 7,058,542 B2 | 6/2006 | Hauhia et al. | 702/183 |
| 7,073,394 B2 | 7/2006 | Foster | 73/861.22 |
| 7,088,285 B2 | 8/2006 | Smith | 342/124 |
| 7,109,883 B2 | 9/2006 | Trimble et al. | 340/870.16 |
| 7,116,036 B2 | 10/2006 | Balasubramaniam et al. | 310/322 |
| 7,129,663 B2 | 10/2006 | Suzuki | |
| 7,136,725 B1 | 11/2006 | Paciorek et al. | 700/295 |
| 7,173,343 B2 | 2/2007 | Kugel | 290/1 R |
| 7,197,953 B2 | 4/2007 | Olin | 73/866.5 |
| 7,233,745 B2 | 6/2007 | Loechner | 398/128 |
| 7,262,693 B2 | 8/2007 | Karschnia et al. | 340/508 |
| 7,271,679 B2 | 9/2007 | Lundberg et al. | 333/24 |
| 7,301,454 B2 | 11/2007 | Seyfang et al. | 340/539.26 |
| 7,319,191 B2 | 1/2008 | Poon et al. | 174/50.62 |
| 7,329,959 B2 | 2/2008 | Kim et al. | 290/2 |
| 7,351,098 B2 | 4/2008 | Gladd et al. | 439/578 |
| 7,539,593 B2 | 5/2009 | Machacek | 702/127 |
| 7,560,907 B2 | 7/2009 | Nelson | 322/37 |
| 7,626,141 B2 | 12/2009 | Rodriguez-Medina et al. | 219/260 |
| 7,726,017 B2 | 6/2010 | Evans et al. | 29/854 |
| 7,835,119 B2 | 11/2010 | Florence et al. | |
| 7,983,049 B2 | 7/2011 | Leifer et al. | 361/728 |
| 8,005,514 B2 | 8/2011 | Saito et al. | 455/572 |
| 8,150,462 B2 * | 4/2012 | Guenter et al. | 455/557 |
| 2001/0025349 A1 | 9/2001 | Sharood et al. | 713/340 |
| 2002/0011115 A1 | 1/2002 | Frick | 73/718 |
| 2002/0029130 A1 | 3/2002 | Eryurek et al. | 702/183 |
| 2002/0065631 A1 | 5/2002 | Loechner | 702/188 |
| 2002/0082799 A1 | 6/2002 | Pramanik | 702/130 |
| 2002/0095520 A1 | 7/2002 | Wettstein et al. | 709/253 |
| 2002/0097031 A1 | 7/2002 | Cook et al. | 323/273 |
| 2002/0105968 A1 | 8/2002 | Pruzan et al. | 370/465 |
| 2002/0148236 A1 | 10/2002 | Bell | 62/3.3 |
| 2002/0163323 A1 | 11/2002 | Kasai et al. | 323/284 |
| 2003/0032993 A1 | 2/2003 | Mickle et al. | 600/509 |
| 2003/0042740 A1 | 3/2003 | Holder et al. | 290/1 A |
| 2003/0043052 A1 | 3/2003 | Tapperson et al. | 640/825.27 |
| 2003/0079553 A1 | 5/2003 | Cain et al. | 73/861.27 |
| 2003/0083038 A1 | 5/2003 | Poon et al. | 455/344 |
| 2003/0097521 A1 | 5/2003 | Pfandler et al. | 711/103 |
| 2003/0134161 A1 | 7/2003 | Gore et al. | 429/12 |
| 2003/0143958 A1 | 7/2003 | Elias et al. | 455/73 |
| 2003/0167631 A1 | 9/2003 | Hallenbeck | 29/835 |
| 2003/0171827 A1 | 9/2003 | Keyes et al. | 700/19 |
| 2003/0199778 A1 | 10/2003 | Mickle et al. | 600/509 |
| 2003/0204371 A1 | 10/2003 | Sciamanna | 702/183 |
| 2004/0081872 A1 | 4/2004 | Herman et al. | 429/26 |
| 2004/0085240 A1 | 5/2004 | Faust | 342/124 |
| 2004/0086021 A1 | 5/2004 | Litwin | 374/120 |
| 2004/0142733 A1 | 7/2004 | Parise | 455/572 |
| 2004/0159235 A1 | 8/2004 | Marganski et al. | 95/116 |
| 2004/0184517 A1 | 9/2004 | Westfield et al. | 375/219 |
| 2004/0199681 A1 | 10/2004 | Hedtke | 710/37 |
| 2004/0200519 A1 | 10/2004 | Sterzel et al. | 136/238 |
| 2004/0203434 A1 | 10/2004 | Karschnia et al. | 455/67.11 |
| 2004/0211456 A1 | 10/2004 | Brown et al. | 136/243 |
| 2004/0214543 A1 | 10/2004 | Osone et al. | 455/197.2 |
| 2004/0218326 A1 | 11/2004 | Duren et al. | 361/93.1 |
| 2004/0242169 A1 | 12/2004 | Albsmeier et al. | 455/91 |
| 2004/0249483 A1 | 12/2004 | Wojsznis et al. | 700/52 |
| 2004/0259533 A1 | 12/2004 | Nixon et al. | 455/414.1 |
| 2005/0011278 A1 | 1/2005 | Brown et al. | 73/861.18 |
| 2005/0017602 A1 | 1/2005 | Arms et al. | 310/339 |
| 2005/0023858 A1 | 2/2005 | Bingle et al. | 296/76 |
| 2005/0029236 A1 | 2/2005 | Gambino et al. | 219/121.69 |
| 2005/0040570 A1 | 2/2005 | Asselborn | 266/99 |
| 2005/0046595 A1 | 3/2005 | Blyth | 340/908 |
| 2005/0056106 A1 | 3/2005 | Nelson et al. | 73/866.5 |
| 2005/0072239 A1 | 4/2005 | Longsdorf et al. | 73/649 |
| 2005/0074324 A1 | 4/2005 | Yoo | 415/4.3 |
| 2005/0076944 A1 | 4/2005 | Kanatzidis et al. | 136/239 |
| 2005/0082949 A1 | 4/2005 | Tsujiura | 310/339 |
| 2005/0099010 A1 | 5/2005 | Hirsch | 290/42 |
| 2005/0106927 A1 * | 5/2005 | Goto et al. | 439/404 |
| 2005/0109395 A1 | 5/2005 | Seberger | 137/8 |
| 2005/0115601 A1 | 6/2005 | Olsen et al. | 136/212 |
| 2005/0118468 A1 | 6/2005 | Adams et al. | 429/22 |
| 2005/0122653 A1 | 6/2005 | McCluskey et al. | 361/92 |
| 2005/0130605 A1 | 6/2005 | Karschnia et al. | 455/90.3 |
| 2005/0132808 A1 | 6/2005 | Brown et al. | 73/592 |
| 2005/0134148 A1 | 6/2005 | Buhler et al. | 310/339 |
| 2005/0139250 A1 | 6/2005 | DeSteese et al. | 136/212 |
| 2005/0146220 A1 | 7/2005 | Hamel et al. | 307/44 |
| 2005/0153593 A1 * | 7/2005 | Takayanagi et al. | 439/352 |
| 2005/0164684 A1 | 7/2005 | Chen et al. | 455/414.1 |
| 2005/0197803 A1 | 9/2005 | Eryurek et al. | 702/185 |
| 2005/0201349 A1 | 9/2005 | Budampati | 370/342 |
| 2005/0208908 A1 | 9/2005 | Karschnia et al. | 455/127.1 |
| 2005/0222698 A1 | 10/2005 | Eryurek et al. | 700/90 |
| 2005/0228509 A1 | 10/2005 | James | 700/19 |
| 2005/0235758 A1 | 10/2005 | Kowal et al. | 73/891.29 |
| 2005/0242979 A1 | 11/2005 | Hamilton et al. | 341/144 |
| 2005/0245291 A1 * | 11/2005 | Brown et al. | 455/572 |
| 2005/0276233 A1 | 12/2005 | Shepard et al. | 370/254 |
| 2005/0281215 A1 | 12/2005 | Budampati et al. | 370/328 |
| 2005/0289276 A1 | 12/2005 | Karschnia et al. | 710/305 |
| 2006/0002368 A1 | 1/2006 | Budampati et al. | 370/351 |
| 2006/0028327 A1 | 2/2006 | Amis | 340/431 |
| 2006/0036404 A1 | 2/2006 | Wiklund et al. | 702/183 |
| 2006/0058847 A1 | 3/2006 | Lenz et al. | 607/5 |
| 2006/0060236 A1 | 3/2006 | Kim et al. | 136/203 |
| 2006/0063522 A1 | 3/2006 | McFarland | 455/423 |
| 2006/0077917 A1 | 4/2006 | Brahmajosyula et al. | 370/310 |
| 2006/0092039 A1 | 5/2006 | Saito et al. | 340/825.37 |
| 2006/0128689 A1 | 6/2006 | Gomtsyan et al. | 514/217.01 |
| 2006/0131428 A1 | 6/2006 | Wang et al. | 235/492 |
| 2006/0142875 A1 | 6/2006 | Keyes, IV et al. | 700/1 |
| 2006/0148410 A1 | 7/2006 | Nelson et al. | 455/67.11 |
| 2006/0181406 A1 | 8/2006 | Petite et al. | 340/521 |
| 2006/0227729 A1 | 10/2006 | Budampati et al. | 370/278 |
| 2006/0274644 A1 | 12/2006 | Budampati et al. | 370/216 |
| 2006/0274671 A1 | 12/2006 | Budampati et al. | 370/254 |

(56) References Cited

U.S. PATENT DOCUMENTS

| | | | |
|---|---|---|---|
| 2006/0278023 A1 | 12/2006 | Garneyer et al. | 73/862.333 |
| 2006/0282580 A1 | 12/2006 | Russell et al. | 710/62 |
| 2006/0287001 A1 | 12/2006 | Budampati et al. | 455/552.1 |
| 2006/0290328 A1 | 12/2006 | Orth | 323/218 |
| 2007/0006528 A1 | 1/2007 | Diebold et al. | 48/197 R |
| 2007/0030816 A1 | 2/2007 | Kolavennu | 370/252 |
| 2007/0030832 A1 | 2/2007 | Gonia et al. | 370/338 |
| 2007/0039371 A1 | 2/2007 | Omata et al. | 73/9 |
| 2007/0054630 A1 | 3/2007 | Scheible et al. | 455/90.3 |
| 2007/0055463 A1 | 3/2007 | Florenz et al. | 702/50 |
| 2007/0135867 A1 | 6/2007 | Klosterman et al. | 607/60 |
| 2007/0229255 A1 | 10/2007 | Loechner | 340/540 |
| 2007/0233283 A1 | 10/2007 | Chen | 700/17 |
| 2007/0237137 A1 | 10/2007 | McLaughlin | 370/389 |
| 2007/0273496 A1 | 11/2007 | Hedtke | 340/506 |
| 2007/0275755 A1 | 11/2007 | Chae et al. | 455/557 |
| 2007/0279009 A1 | 12/2007 | Kobayashi | 320/166 |
| 2007/0280144 A1 | 12/2007 | Hodson et al. | 370/312 |
| 2007/0280178 A1 | 12/2007 | Hodson et al. | 370/338 |
| 2007/0280286 A1 | 12/2007 | Hodson et al. | 370/466 |
| 2007/0280287 A1 | 12/2007 | Samudrala et al. | 370/466 |
| 2007/0282463 A1 | 12/2007 | Hodson et al. | 700/20 |
| 2007/0285224 A1 | 12/2007 | Karschnia et al. | 340/538 |
| 2007/0288204 A1 | 12/2007 | Gienke et al. | 702/188 |
| 2008/0010600 A1 | 1/2008 | Katano | 715/748 |
| 2008/0030423 A1 | 2/2008 | Shigemoto | 343/872 |
| 2008/0054645 A1 | 3/2008 | Kulkarni et al. | |
| 2008/0083446 A1 | 4/2008 | Chakraborty et al. | 136/205 |
| 2008/0088464 A1 | 4/2008 | Gutierrez | 340/606 |
| 2008/0114911 A1* | 5/2008 | Schumacher | 710/72 |
| 2008/0123581 A1 | 5/2008 | Wells et al. | |
| 2008/0141769 A1 | 6/2008 | Schmidt et al. | 73/204.19 |
| 2008/0268784 A1* | 10/2008 | Kantzes et al. | 455/66.1 |
| 2008/0273486 A1* | 11/2008 | Pratt et al. | 370/328 |
| 2008/0280568 A1 | 11/2008 | Kielb et al. | 455/74.1 |
| 2008/0310195 A1 | 12/2008 | Seberger et al. | 363/26 |
| 2009/0015216 A1 | 1/2009 | Seberger et al. | 323/234 |
| 2009/0066587 A1 | 3/2009 | Hayes et al. | 343/702 |
| 2009/0081957 A1 | 3/2009 | Sinreich | 455/68 |
| 2009/0120169 A1 | 5/2009 | Chandler et al. | 73/54.41 |
| 2009/0145656 A1 | 6/2009 | Tschudin | 174/521 |
| 2009/0167613 A1 | 7/2009 | Hershey et al. | 343/702 |
| 2009/0195222 A1 | 8/2009 | Lu et al. | 322/3 |
| 2009/0200489 A1 | 8/2009 | Tappel et al. | 250/492.3 |
| 2009/0253388 A1 | 10/2009 | Kielb et al. | 455/117 |
| 2009/0260438 A1 | 10/2009 | Hedtke | 73/579 |
| 2009/0309558 A1 | 12/2009 | Kielb | 323/234 |
| 2009/0311975 A1 | 12/2009 | Vanderaa et al. | 455/90.3 |
| 2010/0254900 A1 | 10/2010 | Campbell et al. | |

FOREIGN PATENT DOCUMENTS

| | | |
|---|---|---|
| CN | 1251953 | 5/2000 |
| CN | 1 429 354 A | 7/2003 |
| CN | 1 442 822 A | 9/2003 |
| CN | 100386602 C | 4/2005 |
| CN | 1969238 | 5/2007 |
| DE | 2710211 | 9/1978 |
| DE | 3340834 A1 | 5/1985 |
| DE | 3842379 | 6/1990 |
| DE | 196 22 295 | 5/1996 |
| DE | 201 07 112 U1 | 7/2001 |
| DE | 101 04 582 A1 | 10/2001 |
| DE | 100 41 160 | 3/2002 |
| DE | 102 21 931 A1 | 5/2002 |
| DE | 10 2004 020 393 | 11/2005 |
| EP | 0 518 916 B1 | 2/1991 |
| EP | 0 524 550 A1 | 1/1993 |
| EP | 0729294 | 8/1996 |
| EP | 0 895 209 A1 | 2/1999 |
| EP | 0 945 714 | 9/1999 |
| EP | 1 202 145 A1 | 5/2002 |
| EP | 1 192 614 | 1/2003 |
| EP | 1 293 853 A1 | 3/2003 |
| EP | 1879294 | 1/2008 |
| FI | 118699 B | 2/2008 |
| GB | 1 397 435 A | 6/1975 |
| GB | 2 403 043 | 6/2004 |
| JP | 2-35803 | 2/1990 |
| JP | 02067794 | 7/1990 |
| JP | 4-335796 | 11/1992 |
| JP | 8-125767 | 5/1996 |
| JP | 8-249997 | 9/1996 |
| JP | 09-182308 | 7/1997 |
| JP | 2001-524226 | 11/2001 |
| JP | 2002369554 | 12/2002 |
| JP | 2003/042881 | 2/2003 |
| JP | 2003-051894 | 2/2003 |
| JP | 2003051894 | 2/2003 |
| JP | 2003134261 | 5/2003 |
| JP | 2003-195903 | 7/2003 |
| JP | 2004021877 | 1/2004 |
| JP | 2004 146254 | 5/2004 |
| JP | 2004208476 | 7/2004 |
| JP | 2004-317593 | 11/2004 |
| JP | 2005-122744 | 5/2005 |
| JP | 2005-207648 | 7/2005 |
| JP | 2006-180603 | 7/2006 |
| JP | 2007-200940 | 8/2007 |
| JP | 2008-17663 | 1/2008 |
| JP | 2008-504790 | 2/2008 |
| RU | 2 131 934 C1 | 6/1999 |
| RU | 2168062 | 5/2001 |
| RU | 2003128989 | 1/2007 |
| WO | WO 91/13417 | 9/1991 |
| WO | WO 95/07522 | 3/1995 |
| WO | WO 99/53286 | 10/1999 |
| WO | WO 01/01742 | 1/2001 |
| WO | WO 01/48723 | 7/2001 |
| WO | WO 2001/51836 | 7/2001 |
| WO | WO 02/05241 | 1/2002 |
| WO | WO 03/023536 | 3/2003 |
| WO | WO 03/089881 | 10/2003 |
| WO | WO 2004/038998 | 5/2004 |
| WO | WO 2004/082051 | 9/2004 |
| WO | WO 2004/094892 | 11/2004 |
| WO | WO 2005/060482 | 7/2005 |
| WO | WO 2005/086331 | 9/2005 |
| WO | WO 2006/109362 | 10/2006 |
| WO | WO 2007/002769 | 1/2007 |
| WO | WO 2007/031435 | 3/2007 |
| WO | WO 2007/037988 | 4/2007 |
| WO | WO 2008/0098583 | 8/2008 |
| WO | WO 2009/003146 | 12/2008 |
| WO | WO 2009/003148 | 12/2008 |
| WO | WO 2009/063056 | 5/2009 |

OTHER PUBLICATIONS

U.S. Appl. No. 12/855,128, filed Aug. 12, 2010.
U.S. Appl. No. 12/870,448, filed Aug. 17, 2010.
Office Action from Chinese patent Application No. 200580006438.X transmitted Jul. 9, 2008.
Examiner's Consultation from European patent Application No. 05724190.3, dated Jun. 30, 2008.
The second Office Action from Chinese patent Application No. 2005800142124 filed May 5, 2005.
First Office Action from Russian patent application No. 2006145434 dated Oct. 5, 2007.
Office Action from European Application No. 05746241.8, dated Aug. 29, 2007.
Decision on refusal to grant a patent for invention for Russian patent application No. 2006145434, filed May 5, 2005.
"Wireless R&D Aims to Boost Traffic," by M. Moore, InTech with Industrial Computing, Feb. 2002, pp. 40-41.
"System Checks Faraway Machines' Health," by J. Strothman, InTech with Industrial Computing, Feb. 2002, pp. 42-43.
Notification of Transmittal of the International Search Report or the Declaration—PCT/US03/10403 dated Aug. 13, 2003.
"Wireless Management Toolkit XYR 5000", by Honeywell International Inc., Phoenix, Arizona, 3 pgs., Oct. 2003.

(56) References Cited

OTHER PUBLICATIONS

"Wireless Analog Input Transmitters XYR 5000", by Honeywell International Inc., Phoenix, Arizona, 4 pgs., Oct. 2003.
"Quad Analog Output Module Installation and User's Manual", by Honeywell International Inc., Phoenix, Arizona, pp. ii, iii, iv and 1-12, Dec. 2003.
International Search Report and Written Opinion of Application No. PCT/US2005/015848 dated Aug. 10, 2005.
The third Office Action from Chinese patent Application No. 200580014212.4, dated Dec. 19, 2008.
"Wireless Dual Analog Input Interface Transmitter Installation and User's Manual", by Honeywell International Inc., Phoenix, Arizona, pp. ii-vi and 7-43, Dec. 2003.
"XYR 5000 Wireless Dual Analog Input Interface, Model Selection Guide", by Honeywell International Inc., Phoenix, Arizona, Dec. 2003.
"Wireless Measure, Monitor & Control", by Accutech, 4 pgs. May 2003.
"Wireless Instrumentation, Multi-Input Field Unit", by Accutech, 2 pgs., Dec. 2003.
"Quad Analog Output Module", by Accutech, 1 pg. Dec. 2003.
3 Pages from Website www.chemicalprocessing.com, Apr. 2004.
The International Search Report and Written Opinion in Appln No. PCT/US2005/021757 dated Feb. 13, 2006.
International Search Report for International Application No. PCT/US 03/27561, filed Mar. 9, 2003, dated Jun. 15, 2004.
2002 Microchip Technology Inc., "Stand-Alone CAN Controller with SPI™ Interface," pp. 1-75, Mar. 1, 2002.
Rosemount Reference Manual 00809-0100-4022,Rev AA, Jul. 2002, "Model 4600 Oil & Gas Panel Transmitter," 65 pages.
Transmitter Schematic, Sold Jul. 2002, 5 pages.
4 Pages from Website http://content.honeywell.com/imc/eznews/eznews0403/news.htm 2004.
Notification of Transmittal of the International Search Report and the Written Opinion of the International Searching Authority for International Application No. PCT/US2006/025206 dated Nov. 10, 2006.
"Mechatronic Drives in Mobile Hydraulics," Internet Article, Soncebox News. No. 4, Oct. 2004.
Office Action from European Application No. 05853808.3, dated Nov. 6, 2007.
The International Search Report and Written Opinion in Application No. PCT/US2009/003619, dated Sep. 30, 2009.
USA & Metric Thread Standards http://www.carrlane.com/Catalog/index.cfm/29425071F0B221118070C1C513906103E0B05543B0B012009083C3B285357474A2D020609090C0015312A36515F554A5B.
The International Search Report and Written Opinion in Application No. PCT/US2006/035728, dated Jan. 12, 2007.
"Notification of Transmittal of the International Search Report and The Written Opinion of the International Searching Authority" for PCT/US2008/011451 dated Mar. 30, 2009.
The International Search Report and Written Opinion in Application No. PCT/US2009/003616, dated Jan. 13, 2010.
First Examination Report for Indian patent application No. 4676/CHENP/2006 dated Apr. 17, 2009.
Second Examination Report for Indian patent application No. 4676/CHENP/2006 dated Apr. 8, 2010.
The International Search Report and Written Opinion in Application No. PCT/US2009/003636, dated Oct. 6, 2009.
The International Search Report and Written Opinion in Application No. PCT/US2009/003611, dated Nov. 4, 2009.
The International Search Report and Written Opinion in Application No. PCT/US2009/003621, dated Sep. 30, 2009.
Rejection Notice for Japanese patent application No. 2007527282 dated Jul. 22, 2010.
Summons to attend oral proceedings for the European application No. 05746241.8 dated May 26, 2010.
The sixth Office Action from Chinese application No. 2005800014212.4, dated Aug. 17, 2010.
Conclusion and Notification on rehearing for Russian patent application No. 2006145434/09 issued on Sep. 17, 2010.
The seventh Office Action from Chinese patent application No. 200580014212.4 issued on Jan. 31, 2011.
The fourth Office Action from Chinese patent application No. 200580014212.4 issued on Jul. 24, 2009.
Official Letter from Mexican patent application No. PA/A/2006/013488 dated Jun. 25, 2009.
Notification of Transmittal of the International Search Report and the Written Opinion for International application No. PCT/US2009/062152 dated Jun. 2, 2010.
First Office Action for Chinese application No. 200780018710.5 dated May 12, 2010.
First Office Action for Chinese patent application 200680015575.4, filed Jun. 27, 2006.
Search Report and Written Opinion for international patent application No. PCT/US2009/002476, dated Apr. 21, 2009.
Third Office Action from Chinese patent application No. 200580006438.X, dated Sep. 28, 2009.
Second Official Action from Russian patent application No. 2008116682, dated Apr. 13, 2009.
First Official Action from Russian patent application No. 2006134646, dated Mar. 12, 2008.
First Official Action from Russian patent application No. 2008103014, dated Jun. 9, 2009.
First Communication from European patent application No. 06803540.1, dated Jun. 30, 2008.
Fifth Office Action from Chinese patent application No. 200580014212.4, dated Nov. 13, 2009.
Second Office Action for Chinese patent application No. 200680015575.4, dated Sep. 25, 2009.
Third Official Action for Russian patent application No. 2008116682, dated Sep. 11, 2009.
Notification on Results of Examining the Invention for Patentability from Russian patent application No. 2006145434 dated Aug. 1, 2008.
First Rejection Notice issued for Japanese patent application No. 2007-527282 dated Dec. 14, 2009.
Second Office Action from Russian patent application No. 2006145434 dated Apr. 2, 2008.
First Office Action from Chinese Patent Application No. 2005800142124 dated Mar. 14, 2008.
First Official Action from Russian patent application 2008116682, dated Jan. 16, 2009.
Second Office Action from Chinese patent application 200580006438.X, dated Apr. 10, 2009.
Examination Report of the European Patent Office in Application No. 05724190.3 dated Aug. 1, 2007.
The Official Communication from European patent application No. 05746241.8 dated Nov. 12, 2010.
The Minutes in accordance with Rule 124(4) EPC for European application No. 05746241.8 dated Nov. 4, 2010.
Communication pursuant to Rules 161 and 162 EPC from European patent application No. 09767057.4 dated Jan. 26, 2011.
Communication pursuant to Rules 161 and 162 EPC from European patent application No. 09767063.2 dated Jan. 28, 2011.
Communication from corresponding EP application No. 08837236.2 dated Nov. 3, 2010.
Third Office Action for Chinese patent application No. 200680015575.4, dated Jun. 2010.
Fourth Official Action for Russian patent application No. 2008116682, dated Dec. 18, 2009.
English machine translation of JP2004208476 A, 2004.
"Every Little Helps," Economist, vol. 278, No. 8469, p. 78, Mar. 18, 2006.
"Thermal Design and Heat Sink Manufacturing & Testing—Total Thermal and Heat Sink . . . ," http://www.enertron-inc.com/enertron-products/integrated-heat-sink.php, Mar. 31, 2006.
Zahnd et al., "Piezoelectric Windmill: A Novel Solution to Remote Sensing," Japanese Journal of Applied Physics, v. 44, No. 3, p. L104-L105, 2005.
"Heat Pipe—Wikipedia, the free encyclopedia," http://en.wikipedia.org/wiki/Heat_pipe, Mar. 31, 2006.

(56) References Cited

OTHER PUBLICATIONS

Office Action from European patent application No. 07837769.4, dated Jul. 14, 2009.
First Office Action from Australian patent application No. 2005248759, dated Apr. 30, 2009.
Second Office Action from Australian patent application No. 2005248759, dated Aug. 28, 2009.
Decision on Refusal to Grant from Russian patent application No. 2006145434 dated Feb. 18, 2011.
Office Action from related European Application No. EP 09767062.4, dated Jul. 13, 2011, 5pgs.
Notification of Transmittal of the International Search Report and the Written Opinion for the international patent application No. PCT/US2010/047463 dated Dec. 1, 2010.
Second Office Action for the corresponding Chinese patent application No. 200680035248.5 dated Oct. 19, 2011, 22 pages.
First Office Action from the corresponding Chinese patent application No. 200980122611.0 dated Nov. 23, 2011.
Official Action for the corresponding Russian patent application No. 2011101386 transmitted Dec. 23, 2011.
Office Action from Chinese Patent Application No. 200880110323.9, dated Jan. 29, 2012.
Written Opinion from Singapore Patent Application No. 201009093-4, dated Feb. 20, 2012.
Written Opinion and Search Report from the related Singapore patent application No. 201009226-0 dated Mar. 16, 2012.
Office Action from the related Russian patent application No. 2011301364 dated Feb. 8, 2012.
Communication Pursuant to Rules 161(1) and 162 EPC for application Serial No. EP 09767062.4, dated Jan. 27, 2011.
The International Search Report from PCT Application No. PCT/US2011/047026, dated Jul. 11, 2011, 4 pgs.
The Written Opinion from International Search Report from PCT Application No. PCT/US20111047026, dated Jul. 11, 2011, 8 pgs.
Communication Pursuant to Rules 161(1) and 162 EPC for application Serial No. EP 10752246.8, dated May 3, 2012.
Written Opinion for the related Singapore patent application No. 2010092278 dated Feb. 16, 2012.
Written Opinion for the related Singapore patent application No. 2010092245 dated Jan. 6, 2012.
Japanese Office Action from JP 2011-514605, dated Jun. 19, 2012.
Communication Pursuant to Rules 161(1) and 162 EPC for application Serial No. EP 10765871.8, dated Apr. 27, 2012.
Office Action from Russian patent application No. 2011101386 dated Apr. 23, 2012, 4 pages.
Chinese Office Action from CN200980122835.1, dated Jul. 3, 2012.
Chinese Office Action from CN200980122761.1, dated Aug. 31, 2012.
First Office Action from Japanese patent application No. 2011514603, dated Jul. 10, 212.
First Office Action from Chinese patent application No. 200980122613.X, dated Aug. 15, 2012.
Second Office Action from Chinese patent application No. 200980122611.0 dated Aug. 20, 2012.
Official Action from Canadian patent application No. 2563337 dated Sep. 4, 2012.
Chinese First Official Action dated Jul. 15, 2013 in Chinese patent Appln. No. 201080012851.8, filed Sep. 1, 2010. 8 pgs. with English Translation.
Official Action from Russian patent application No. 2009139488, dated Oct. 8, 2012. 3 pages.
Examination Report for the related Singapore application No. 201009226-0 dated Oct. 12, 2012.
Invitation to Response to Written Opinion for Singapore application No. 201009093-4 dated Nov. 5, 2012.
Official Action from the related Canadian patent application No. 2726613 dated Jan. 11, 2013.
Official Action from the related Canadian patent application No. 2726608 dated Dec. 5, 2012.
Examination Report from the related Singapore patent application No. 2010092278 dated Jan. 7, 2013.
Decision of Rejection (final rejection) for Japanese Patent Application No. 2011-514604, dated Jan. 29, 2013, 8 pages.
Second Office Action for Chinese Patent Application No. 200980122835.1, dated Mar. 15, 2013, 20 pages.
Official Action for Canadian Patent Application No. 2,726,601, dated Apr. 12, 2013, 3 pages.
Second Office Action from Chinese patent application No. 200980122613.X, dated May 9, 2013.
First Office Action from the related Japanese patent application No. 2012527988, dated May 14, 2013.
Office Action from corresponding Japanese patent application No. 2012527994 dated Jun. 11, 2013.

* cited by examiner

WIRE HARNESS FOR FIELD DEVICES USED IN A HAZARDOUS LOCATIONS

CROSS-REFERENCE TO RELATED APPLICATION

The present application is based on and claims the benefit of U.S. provisional patent application Ser. No. 61/239,120 filed Sep. 2, 2009; and is a continuation-in-part application of U.S. patent application Ser. No. 12/485,169, filed Jun. 16, 2009, the contents of which are hereby incorporated by reference in its entirety.

BACKGROUND

In industrial settings, control systems are used to monitor and control inventories of industrial and chemical processes and the like. Typically, the control system performs these functions using field devices distributed at key locations in the industrial process and coupled to the control circuitry in the control room by a process control loop. The term "field device" refers to any device that performs a function in a distributed control or process monitoring system including all devices currently known, or yet to be known, used in the measurement, control, and monitoring of industrial processes.

Some field devices include a transducer. A transducer is understood to mean either a device that generates an output signal based on a physical input or that generates a physical output based on an input signal. Typically, transducers transform an input into an output having different form. Types of transducers include various analytical sensors, pressure sensors, theimistors, thermocouples, strain gauges, level sensors, digital valve controllers, flowmeters, flow computers, positioners, actuators, solenoids, indicator lights, and others.

Typically, each field device also includes communication circuitry that is used for communicating with a process control room or other circuitry over a process control loop. In some installations, the process control loop is also used to deliver a regulated current and/or voltage to the field device for powering the field device. Process control loop also carries data, either in an analog or digital format.

Traditionally, analog field devices have been connected to the control room by two-wire process control current loops with each device connected to the control room by a single two-wire control loop. Typically, a voltage differential is maintained between the two wires within a range of voltages from 12-45 volts for analog mode and 9-50 for digital mode. Some analog field devices transmit a signal to the control room by modulating the current running through the current loop to a current that is proportional to the sensed process variable. Other analog field devices can perform an action under the control of the control room by controlling the magnitude of the current through the loop. In addition to, or in the alternative, the process control loop can also carry digital signals used for communication with field devices.

In some installations, wireless technologies have begun to be used to communicate with field devices. Wireless operation simplifies field device wiring and setup. However, the majority of field devices are hardwired to a process control room and do not use wireless communication techniques.

Industrial process plants often contain hundreds or even thousands of field devices. Many of these field devices contain sophisticated electronics and are able to provide more data than the traditional analog 4-20 mA measurements. For a number of reasons, cost among them, many plants do not take advantage of the extra data that may be provided by such field devices. This has created a need for a wireless adapter for such field devices that can attach to the field devices and transmit data back to a control system or other monitoring or diagnostic system or application via a wireless network.

In order to operate an industrial process plant, field devices must often carry hazardous location approval ratings. There are different types of ratings and, to be widely adopted, a wireless field device adapter should be able to attach to each such field device without compromising the hazardous location approval rating of that field device.

One of these approval ratings is known as an explosion-proof or explosion-protected rating. The purpose of an explosion-proof enclosure is to contain an explosion should flammable gas enter the enclosure and ignite. If the enclosure fails to contain the explosion, it could ignite surrounding gases with catastrophic results.

Another type of approval rating is known as intrinsic safety (IS). An intrinsically safe device prevents ignition of flammable gases by limiting the amount of energy present in the electronics and by ensuring that electronic components are spaced far enough apart to prevent arcing in the event of an electrical fault. The heat generated by electronic components is also controlled. Making the electronics of a device intrinsically safe tends to drive up the number of components as well as increase circuit board size. This also poses a challenge when the form factor of a device must be minimized.

In order for a wireless communication adapter to be used in explosion-proof installations, it must be explosion-protected itself and it must provide an explosion-proof barrier at the connection between the two devices. For an intrinsically safe installation, the wireless communication circuitry must be intrinsically safe as well. The ability to attach such an adapter to any device also drives the form factor. Industrial devices, such as field devices, can be installed in many configurations and are often disposed in tight spaces. This necessitates a small and unobtrusive design. To achieve this, it is beneficial for the antenna to be integral to the wireless communication adapter and for the circuit board size to be minimized. This complicates design for installations that require either explosion-proof certification or intrinsically-safe certification.

Providing a wireless communication that facilitates compliance with explosion-proof certifications and/or intrinsic safety would advance the art of wireless process communication.

SUMMARY

A wireless process communication adapter includes a housing having a first end and a second end. A field device coupling is attached to one of the first and second ends. Adapter circuitry is disposed within the housing and the adapter circuitry is coupled to a plurality of wires that pass through the field device coupling. A wire retainer is engaged upon the plurality of wires to maintain the wires in a fixed position. An encapsulation material encapsulates the adapter circuitry, the wire retainer, and the plurality of wires.

DETAILED DESCRIPTION OF ILLUSTRATIVE EMBODIMENTS

Some embodiments of the present invention stem from the realization that the wire harness of a wireless process communication adapter can allow gases to travel through the insulation or braiding of the wire and reach the electronics. The wire harness (shown in FIG. 3) is used to connect the wireless process communication adapter to the field device so that the field device or adapter can receive and transmit data. To prevent gases from traveling through the insulation and/or braiding of the wire and reaching the electronics, some embodiments of the present invention generally provide an interconnect or a portion where the wires are stripped and tinned within an encapsulation substance that thereby blocks entry of any gases. Preferred embodiments generally employ stripping and tinning of the wires and potting to provide a simpler and cost-effective method of maintaining the encapsulation hazardous locations approval. Further details will be described later in the specification. For reference, it is useful to discuss the wireless process communication adapter and the manner in which it connects to and interacts with the field device.

Figure 1:
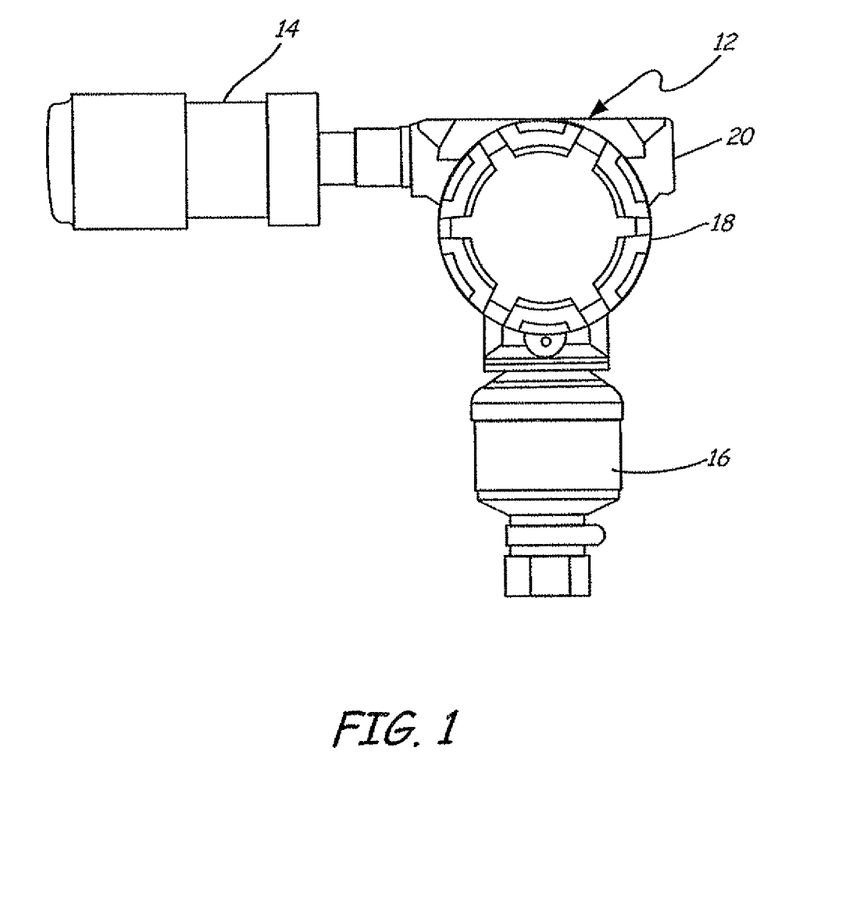
FIG. 1 is a diagrammatic view of a process-wired field device operably coupled to the wireless communication adapter in accordance with an embodiment of the present invention.

FIG. 1 is a diagrammatic view of a process-wired field device 12 operably coupled to a wireless communication adapter 14, in accordance with an embodiment of the present invention. While field device 12 is illustrated in FIG. 1 as a process fluid pressure transmitter, such as that sold under the trade designation Model 3051S, available from Emerson Process Management of Chanhassen, Minn., any suitable field device may be used. Typically, a field device includes a sensor module, such as sensor module 16, and an electronics module, such as electronics module 18. Further, as set forth above, field device 12 is often designed for compliance with explosion-proof regulations. Further, the design of electronics within field device 12 can be in accordance with an intrinsic safety requirement, such as one or more of the portions of the standard promulgated by Factory Mutual Research in October 1998 entitled APPROVAL STANDARD INTRINSICALLY SAFE APPARATUS AND ASSOCIATED APPARATUS FOR USE IN CLASS I, II, AND III, DIVISION 1 HAZARDOUS (CLASSIFIED) LOCATIONS, CLASS NUMBER 3610. Field device 12 typically includes a sensor, such as a pressure sensor, in sensor module 16 which transduces a process fluid characteristic, such as pressure, and provides an electrical indication of that process fluid variable to electronics module 18. Electronics module 18 then communicates process variable information over a process communication loop which typically couples via input 20.

As described above, it is becoming advantageous to provide additional communication abilities, such as a wireless communication ability, to process wired field devices. By providing a wireless process communication adapter, such as process communication adapter 14, additional digital information can be conveyed beyond that transmitted through the process wired connection. Such information may be communicated to a separate monitoring or diagnostic system or application for analysis. Further, the simple provision of an additional communication resource, such as adapter 14, also allows for redundant communication. It is important for process communication adapter 14 to be coupleable to field devices without adversely affecting the assembly's ability to continue to meet explosion-proof and/or intrinsic safety requirements.

Figure 2:
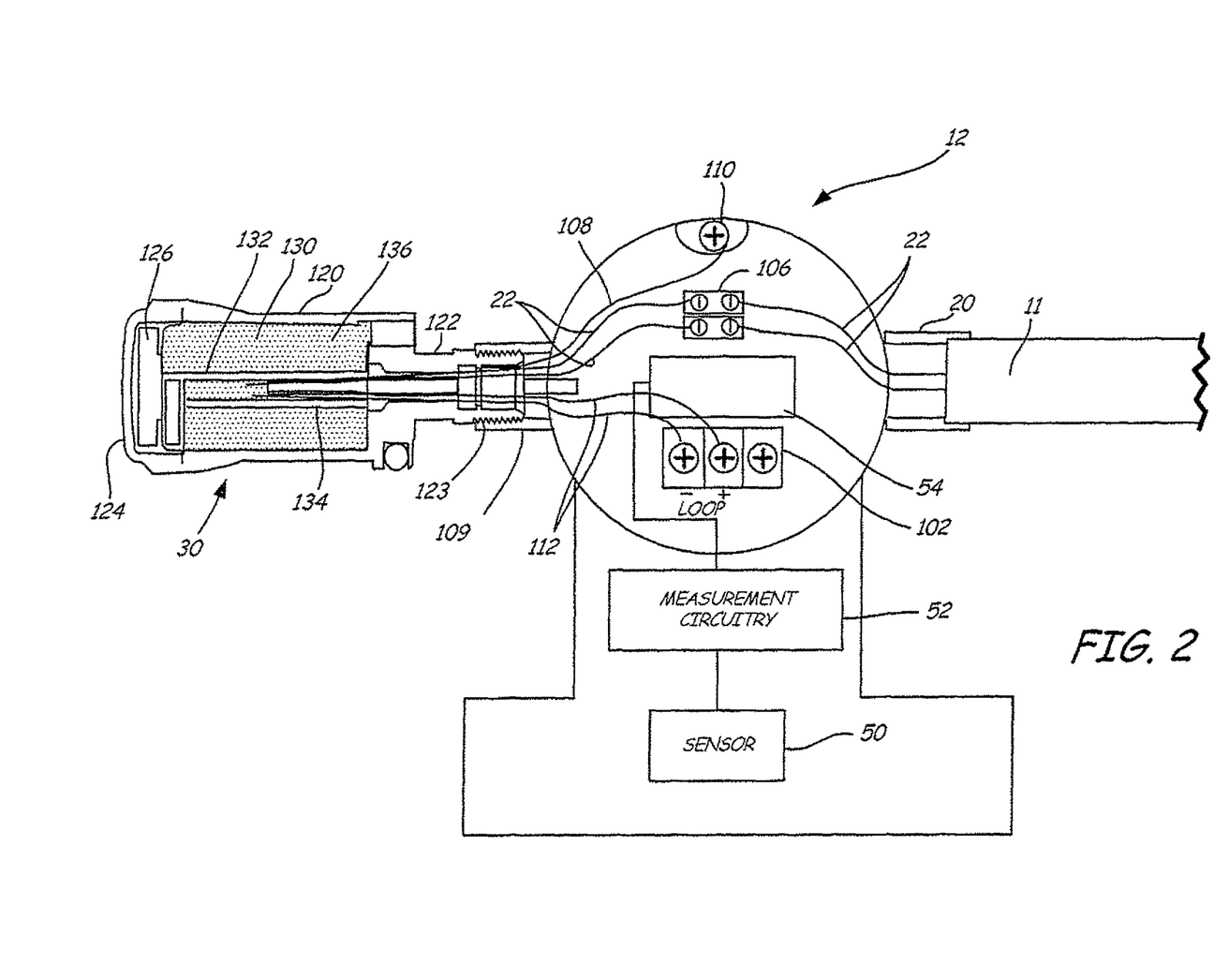
FIG. 2 shows a simplified cross-sectional view of a field device and wireless process communication adapter in accordance with an embodiment of the present invention.

FIG. 2 shows a simplified cross-sectional view of field device 12 and wireless process communication adapter 30 in accordance with an embodiment of the present invention. Field device 12 is coupled to process communication loop 22 through input 20 and conduit 11. Examples of process communication loops include the Highway Addressable Remote Transducer (HART®) protocol and the FOUNDATION™ Fieldbus protocol. However, other wired process communication protocols are known. In the example of a process variable transmitter, field device 12 includes a process variable sensor 50 which is connected to measurement circuitry 52 to measure a process variable. Transmitter circuitry 54 is configured to receive the process variable and communicate the process variable onto the two-wire process control loop 22 using known techniques. Field device 12 couples to two-wire process control loop 22 via wireless communication adapter 30 and through connection block 106. Wireless communication adapter 30 couples to two-wire process control loop 22 through connection block 106 and is mounted to the housing of field device 12, for example, through threaded connections 123 and 109. The chassis of the wireless process communication adapter 30 couples to an electrical ground connector 110 of field device 12 through wire 108. Field device 12 includes two-wire process connection block 102 which couples to connection 112 from wireless process communication adapter 30. Housing 120 of wireless process communication adapter 30 carries an antenna 126 which couples to wireless communication circuitry of the wireless process communication adapter 30. A radio-frequency (RF) transparent end cap 124 can be used to sealably couple to housing 120 to allow transmission of RF signals therethrough. In the arrangement shown in FIG. 2, five electrical connections are provided to the radio-frequency adapter, which include four loop connections along with an electrical ground connection.

Figure 3:
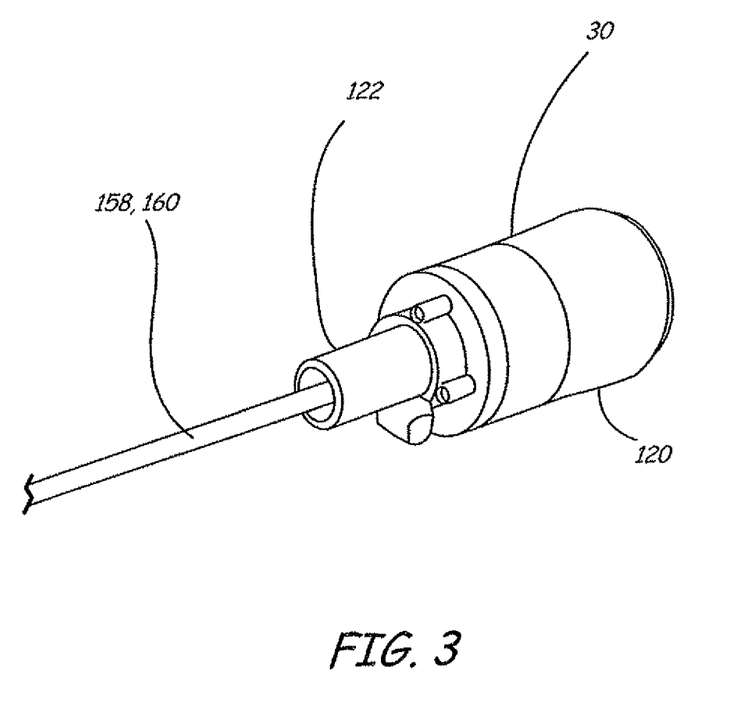
FIG. 3 is a perspective view of a wireless process communication adapter in accordance with an embodiment of the present invention.

FIG. 3 is a perspective view of a wireless process communication adapter 30 in accordance with an embodiment of the present invention. Adapter 30 generally includes housing 120 that carries electronics and wireless communication circuitry therein. Field device coupling 122 is also provided to couple adapter 30 to a suitable field device. The electrical connection between adapter 30 and a suitable field device is generally via a plurality of wires, illustrated diagrammatically at reference numerals 158, 160. While two wires are shown in FIG. 3, in one embodiment, four wires, or more, are actually used to electrically couple the process communication adapter to a field device.

Figure 4:
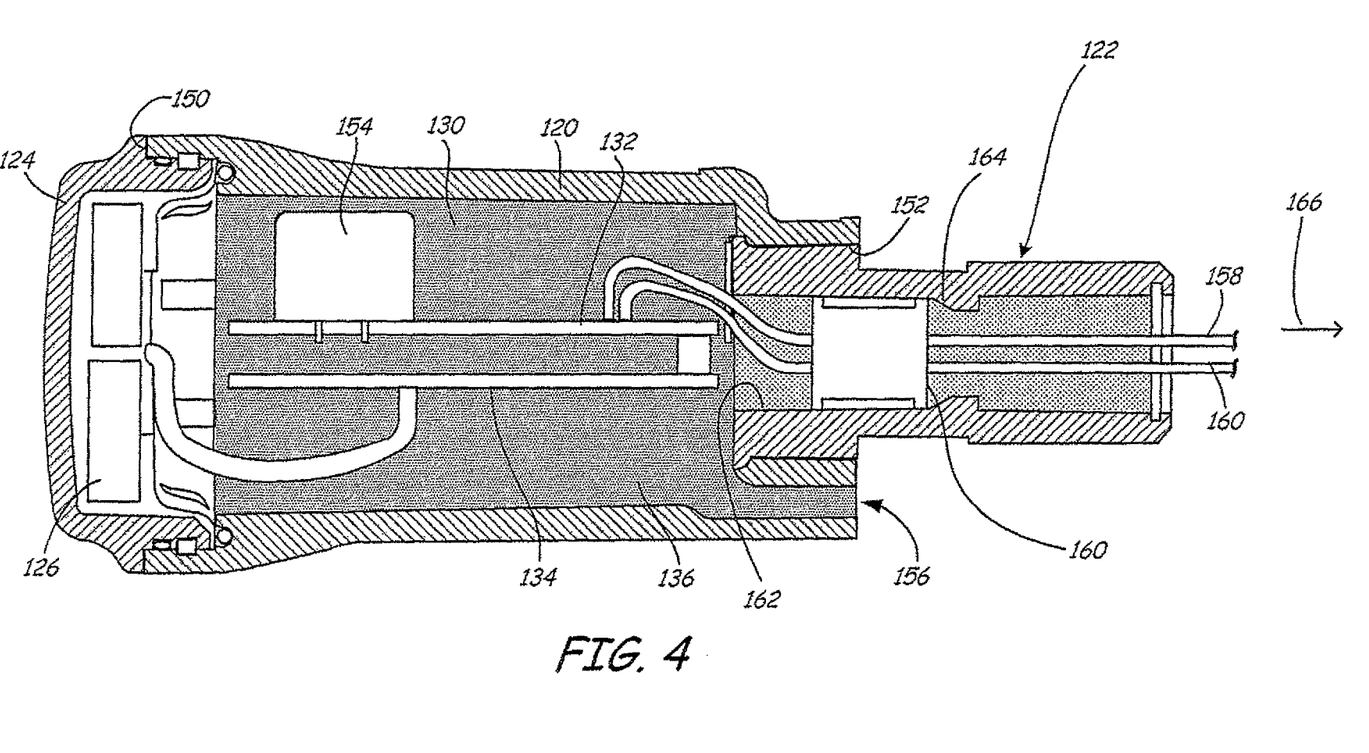
FIG. 4 is a cross-sectional diagrammatic view of a wireless process communication adapter in accordance with an embodiment of the present invention.

FIG. 4 is a cross-sectional diagrammatic view of a wireless process communication adapter in accordance with an embodiment of the present invention. As illustrated in FIG. 4, wireless process communication adapter preferably includes a cylindrical, metal enclosure 120 with a large opening 150 at one end to accommodate radio-frequency transparent radome or end cap 124, and a relatively small opening 152 at the other end to accommodate field device coupling 122. Electronics 154 reside within cavity 130 preferably on a pair of printed circuit boards 132, 134. The electronics preferably include wireless communication circuitry to allow wireless process communication adapter to communicate in accordance with one or more wireless communication protocols. Examples of suitable wireless process communication protocols include: wireless networking technologies (such as IEEE 802.11b wireless access points and wireless networking devices built by Linksys of Irvine, Calif.); cellular or digital networking technologies (such as Microburst® by Aeris Communications Inc. of San Jose, Calif.); ultra wide band, free space optics, Global System for Mobile Communications (GSM), General Packet Radio Service (GPRS); Code Division Multiple Access (CDMA); spread spectrum technology, infrared communications techniques; SMS (Short Messaging Service/text messaging); a known Bluetooth Specification, such as Bluetooth Core Specification Version 1.1 (Feb. 22, 2001), available from the Bluetooth SIG (www.bluetooth.com); and the WirelessHART Specification published by the Hart Communication Foundation, for example. Relevant portions of the Wireless HART® Specification include: HCF_Spec 13, revision 7.0; HART Specification 65—Wireless Physical Layer Specification; HART Specification 75—TDMA Data Link Layer Specification (TDMA refers to Time Division Multiple Access); HART Specification 85—Network Management Specification; HART Specification 155—Wireless Command Specification; and HART Specification 290—Wireless Devices Specification.

The electronics on each circuit board 132, 134 are preferably mounted with spacing around them, and between the circuit boards, to facilitate flow of a potting compound. With the enclosure sealed, a potting 136 is injected into chamber 130 through passageway 156 until the enclosure is full. Any suitable potting compound can be used, but it is important for the potting material itself to meet the requirements of the approval agencies, which include suitable chemical resistance, thermal endurance at hot and cold operating temperatures, as well as other relevant parameters. Radome 124, enclosure 120, and field device coupling 122 provide a weather-tight shell for potting 136.

Field device coupling 122 provides a method of attaching directly to field device 12. A feedthrough assembly preferably also serves as an explosion-proof barrier at the connection point. If flammable gases enter the enclosure of the field device and ignite, feedthrough assembly 140 will contain the explosion. Wires 158, 160 pass through feedthrough assembly 140. The interior of coupling 122 is filled with a potting capable of withstanding explosive pressure.

Field device coupling 122 helps seal the wiring harness such that gases, such as corrosive or explosive gases, are blocked from entry into chamber 130 and cannot reach electronics 154. This is important because the wireless process adapter is designed to meet the explosion-proof and potentially intrinsically safe specifications that the field devices, to which it must couple, comply. Importantly, the wire harness itself must also meet all of the requirements for hazardous locations approvals. The wire harness of process communications adapter 30 preferably includes four wires which are packed very closely to one another. For intrinsically safe hazardous location approval, the insulation thickness on the wires is specifically chosen to be thick enough that when touching there is still a space in between the conductors within the wires to meet the intrinsically safe approval spacing requirements.

Embodiments of the present invention preferably include wires that have a portion of their insulation stripped. Further, it is preferred to use braided wire for the wiring harness. In order to prevent gases from traveling through the braiding or the space between the individual braids and the insulation, each wire is stripped along a portion of the wire and the stripped portion is then tinned, brazed, or otherwise processed to fuse the braids together and to provide a relatively solid and continuous conductor. Wire retainer 160 maintains the stripped and tinned portions of the wires at a proper spacing to comply with intrinsic safety requirements. Wire retainer 160 also controls the wire orientation so that the stripped sections do not touch each other or the wall of coupling 122 that the wires pass through. If the wires were to touch each other or the wall of the coupling 122, it could cause the entire field device or wireless process communication adapter to malfunction. When the wireless process communication adapter is filled with the encapsulation material (such as material 136), it is extremely important that the wires not move during the filling process or during the curing process.

Figure 7:
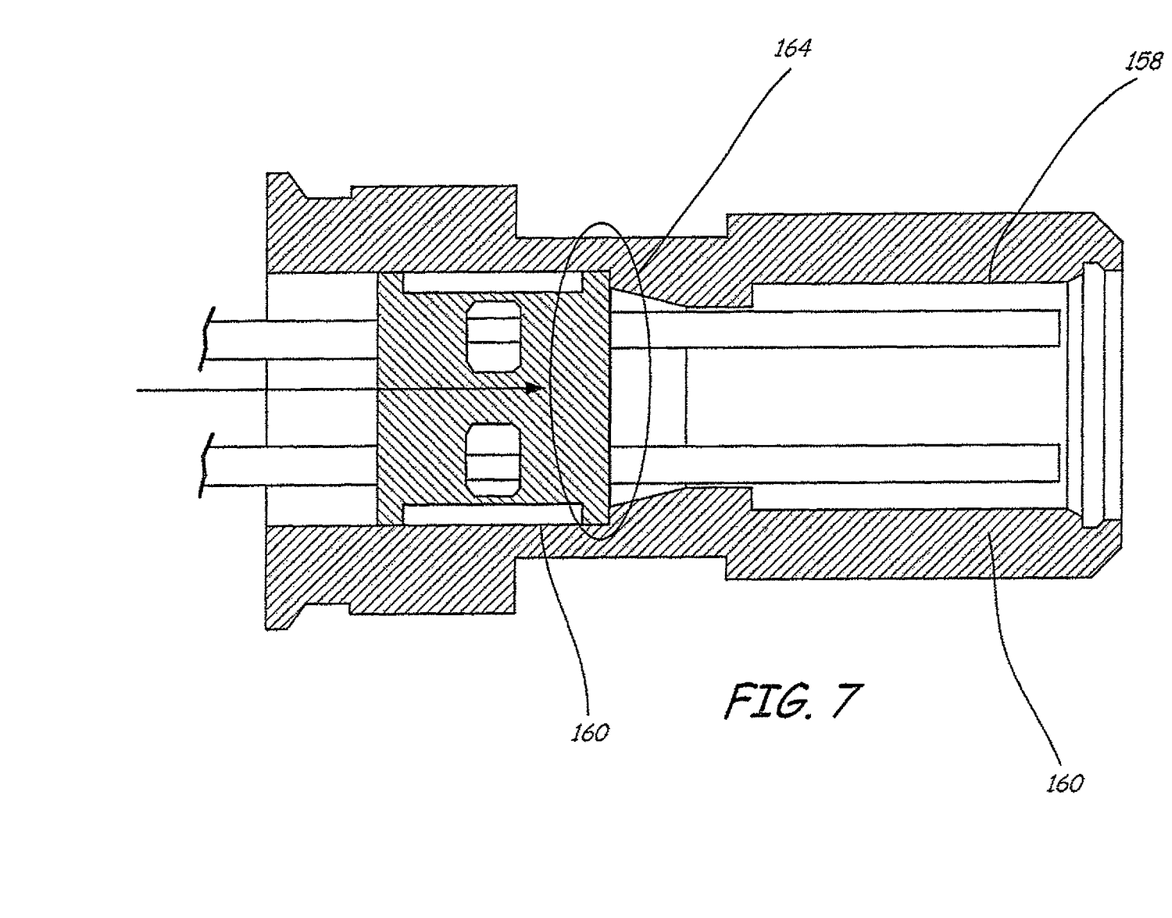
FIG. 7 is a cross-sectional view of a wire harness retainer disposed within a portion of a wireless process communication adapter in accordance with an embodiment of the present invention.

Another consideration for the wire harness is that of mechanical strength. The wire harness is typically soldered to a circuit board inside adapter 30. Until the adapter is fully encapsulated at the end of the assembly process, the only joint the wire harness has with the rest of the assembly is the soldered joint. This means that if the wireless process communication adapter is handled by its wire harness, it could induce stress on the soldered joints. That stress could damage the soldered joints. Accordingly, it is also preferred that wire retainer 160 also incorporate a method of holding the wires in place and distributing any force from the wires into the fitting instead of the soldered joints. One way in which this is done is illustrated in FIGS. 4 and 7. Specifically, the wire retainer 160 is sized such that it may pass into aperture 162 of field device coupler 122 and slide until it reaches tapered portion 164. Thereafter, if wires 158, 160 are pulled in the direction illustrated by arrow 166, the wire retainer is simply urged into tapered portion 164 and no stress is imparted upon the soldered joints electrically coupling wires 158, 160 to circuit board 132.

Figure 5:
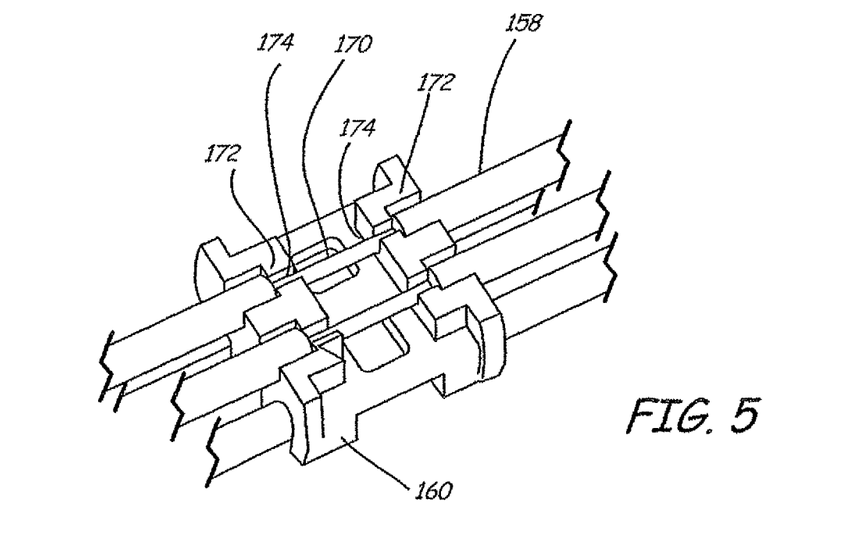
FIG. 5 is a perspective view of a wire harness retainer for a wireless process communication adapter in accordance with an embodiment of the present invention.
Figure 6:
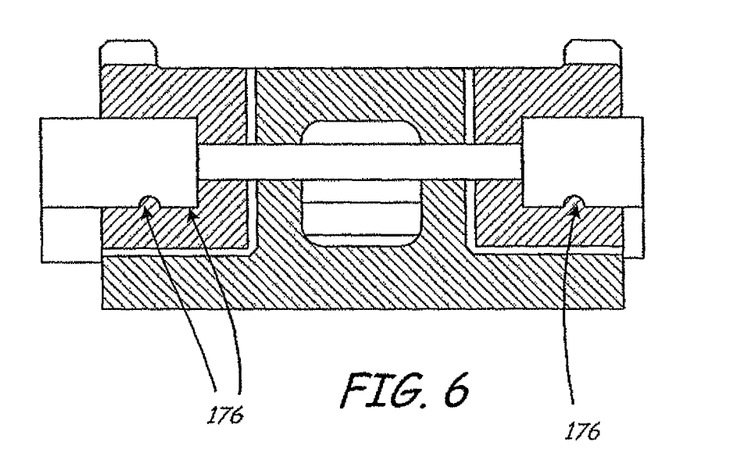
FIG. 6 is a side elevation view of a wire harness retainer for a wireless process communication adapter in accordance with an embodiment of the present invention.

FIG. 5 is an enlarged perspective view of a wire retainer 160 in accordance with an embodiment of the present invention. As illustrated, wire retainer 160 retains four wires, two illustrated on top and two that are shown on the bottom. Each wire is stripped of its insulation, and the stripped portion is tinned or otherwise fused. For example, wire 158 can be seen in FIG. 6 having stripped portion 170. Wire retainer 160 includes important features for the proper retention of the wires. One feature takes advantage of the dimensional difference between the insulation and the stripped wire. Since the insulation has a much larger outer diameter, there is a shoulder 172 for the insulation to sit on which helps locate the wires when the wires are placed in the wire retainer. Proximate each shoulder 172 is a necked down portion 174 that has a width that is sized to pass the tinned conductor portion, but is too small to fit the insulation. Thus, when a given wire, such as wire 158, is retained within retainer 160, all axial forces along the length of the wire are essentially frozen and transferred to wire retainer 160. Additionally, with the necked down portions 174, the tinned portions of the wires are maintained at a fixed distance from one another. Another important feature of wire retainer 160 is illustrated in FIG. 6 in the form of ribs 176. These ribs are designed to generate an interference fit which causes the insulation on the wires to deform around the rib, which helps maintain the wires in place. In this manner, wire retainer 160 creates a mechanical joint that effectively distributes any force imparted from the wires (such as created by someone pulling on the wires or the wireless process communication adapter being handled by its wires) to field device coupling 122. As set forth above, this prevents any stress from being applied to the solder joints on circuit board 132.

Preferably, the wire size used for the wire harness is 22 gauge. The wires are selected to have a thick enough insulation so that when sitting side by side, the spacing between the conductors exceeds the minimum spacing requirement for the intrinsically safe hazardous locations approval. Preferably, the wires are stripped along their length a minimum of 0.200 inches and, since the wires are stranded, they are tinned along this full length to fill the gaps between the wire strands. However, those skilled in the art will recognize that any number of adaptations can be provided to wires with any variation of insulation thickness, wire gauge, and conductor style. Accordingly, embodiments of the present invention are not limited to the specific wire configurations set forth in the embodiments herein.

As set forth above, wire retainer 160 holds the wires in the correct orientation during manufacture. Moreover, the utilization of the ribs 176 helps maintain the insulation of the wires, but also renders retainer 160 relatively simple to injection mold, which helps keep production costs low. Although the embodiment illustrated in FIGS. 5-7 is preferred, the invention can be practiced with other wire retainer configurations.

Figure 8:
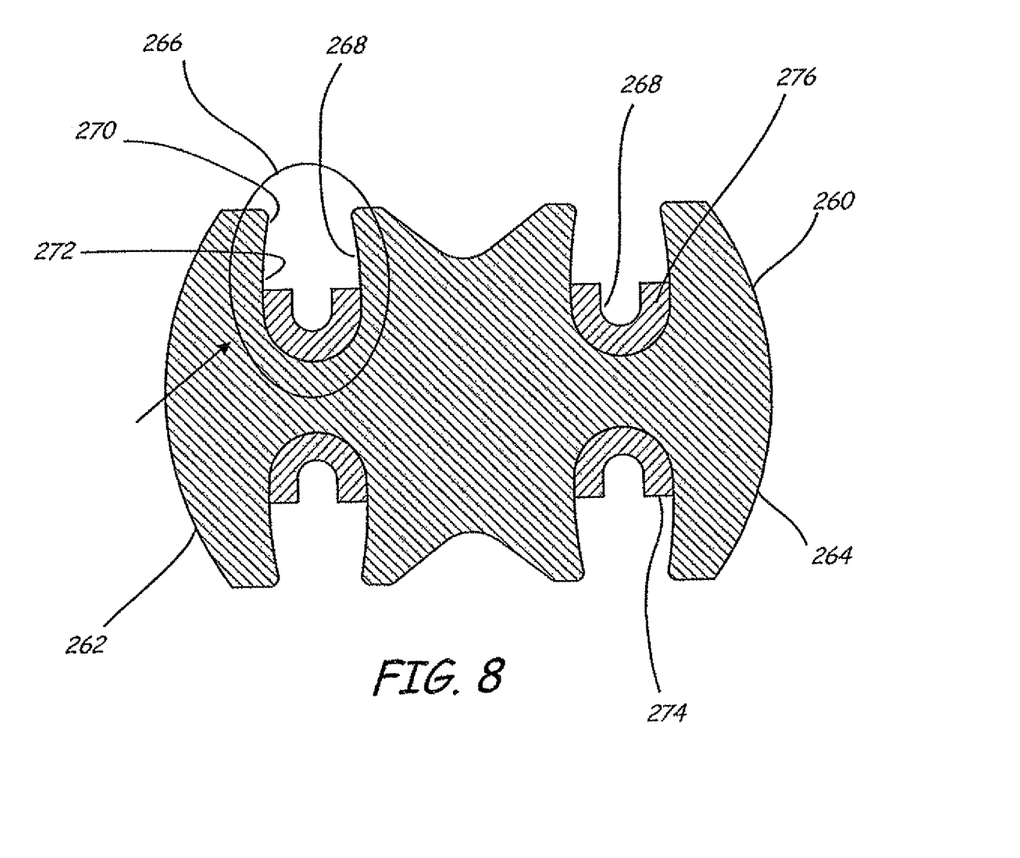
FIG. 8 is a diagrammatic view of a wire retainer for a wireless process communication adapter in accordance with an embodiment of the present invention.

FIG. 8 illustrates a wire retainer 260 in accordance with an alternate embodiment of the present invention. Wire retainer 260 preferably has a pair of surfaces 262, 264 that have a radius sized to substantially match the inner diameter of coupling 122. Additionally, each wire retention position 266 of retainer 260 includes a U-shaped groove 268 with an inlet 270 that is narrower than portion 272. In this manner, portion 270 is sized to interfere with the insulation of the wire in such a way that the insulation, or portion 270, must deform to allow the wire to pass therethrough. This creates a snap-fit for the wires. Retainer 260 also includes necked down portions 274 that include a relatively small groove to receive the stripped and tinned conductor of the wire. Additionally, surface 276 is also useful to abut against the surface of the insulator.

Figure 9:
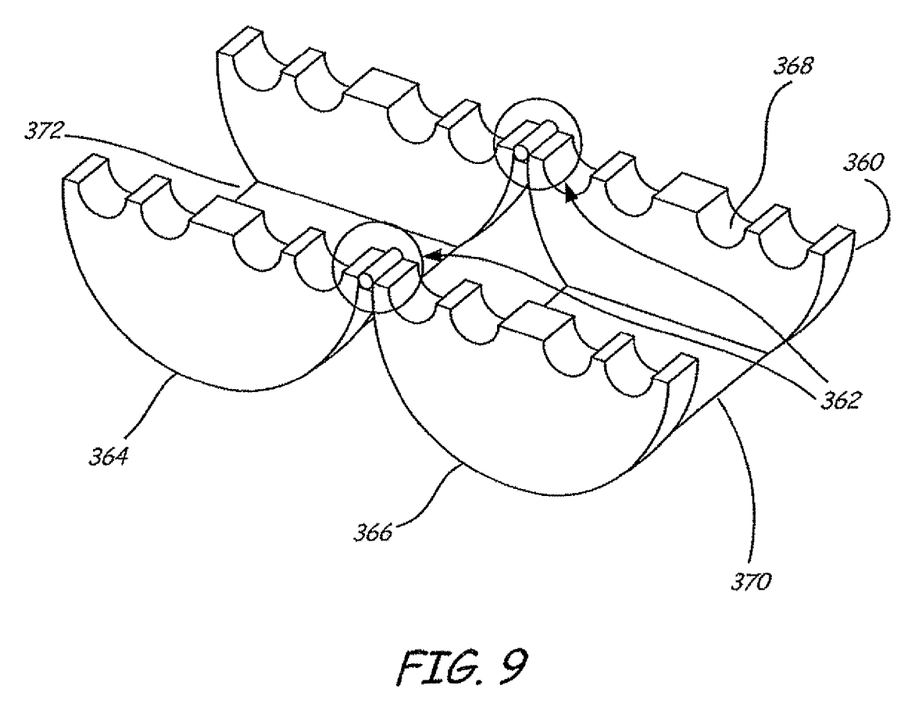
FIG. 9 is a perspective view of an alternate wire harness retainer for use with a wireless process communication adapter in accordance with an embodiment of the present invention.

FIG. 9 is a diagrammatic view of a wire retainer 360 in accordance with another embodiment of the present invention. Retainer 360 is essentially a hinged plastic or non-metallic piece that is preferably designed to clasp or otherwise latch together to hold the wires therein. As illustrated in FIG. 9, retainer 360 includes a pair of hinges 362 about which opposing members 364 and/or 366 pivot. In this manner, once the wires are all disposed in their respective grooves, the wire retainer 360 can be closed and preferably latched to hold the wires in place. FIG. 9 also illustrates that wire retainer 360 includes a number of ribs 368 that are preferably sized to generate an interference with insulation to help retain the wires in place. Further, retainer 360 includes covers 370 and 372.

Wireless process communication adapter 30 thus preferably uses encapsulation and adaptation of a feedthrough assembly to provide explosion and environmental protection and to reduce the spacing required between electronic components for intrinsic safety protection. Intrinsic safety spacing requirements are less stringent when the space between the components is filled with potting. This allows the entire device to be miniaturized more effectively. Encapsulation achieves explosion protection by excluding flammable gases entirely. The electronics of wireless process communication adapter 30 are completely surrounded by potting and therefore protected from the environment.

The wiring harness package(s) set forth in the various embodiments of the present invention generally allow wireless process communication adapters to achieve explosion-proof encapsulation and intrinsically safe hazardous location approval. The design of the wires prevents any gases from traveling along the wire to reach the encapsulated electronics. The design of the wire and the wire retainer ensures proper spacing for intrinsic safety requirements and also provides stress relief for the soldered joints. Further, the design of the wires in conjunction with the wire retainer makes a complete wire harness package that is useful for hazardous location approvals.

Although the present invention has been described with reference to preferred embodiments, workers skilled in the art will recognize that changes may be made in form and detail without departing from the spirit and scope of the invention.

What is claimed is:

1. A wireless process communication adapter comprising:
a housing having a first end and a second end;
a field device coupling attached to one of the first and second ends;
adapter circuitry disposed within the housing, the adapter circuitry being coupled to a plurality of wires that pass through the field device coupling, wherein each of the plurality of wires includes a stripped portion;
a wire retainer engaged upon the plurality of wires to maintain the wires in a fixed position, and wherein the wire retainer includes a pair of shoulders for each wire, wherein each shoulder engages a surface of wire insulation to limit axial movement of the wire; and
an encapsulation material encapsulating the adapter circuitry, the wire retainer, and the plurality of wires.

2. The wireless process communication adapter of claim 1, wherein each stripped portion includes braided wire strands that are tinned.

3. The wireless process communication adapter of claim 1, wherein the plurality of wires include 4 wires.

4. The wireless process communication adapter of claim 1, wherein the plurality of wires are braided wires.

5. The wireless process communication adapter of claim 1, wherein the plurality of wires are 22 gauge wires.

6. The wireless process communication adapter of claim 1, wherein the plurality of wires are connected via solder joints to a circuit board supporting the adapter circuitry.

7. The wireless process communication adapter of claim 1, wherein the wire retainer includes a groove for each wire that is shaped to generate a snap-fit.

8. The wireless process communication adapter of claim 1, wherein the wire retainer includes a pair of opposing members that connect to one another via at least one hinge.

9. The wireless process communication adapter of claim 7, wherein at least one of the opposing members includes a rib configured to interfere with an insulation portion of a wire when the opposing members are engaged together.

10. The wireless process communication adapter of claim 7, wherein the opposing members are configured to clasp together.

11. The wireless process communication adapter of claim 1, wherein the wireless process communication adapter is intrinsically safe.

\* \* \* \* \*